(12) United States Patent
Sakata et al.

(10) Patent No.: US 10,216,566 B2
(45) Date of Patent: Feb. 26, 2019

(54) FIELD PROGRAMMABLE GATE ARRAY

(71) Applicant: Hitachi, Ltd., Chiyoda-ku, Tokyo (JP)

(72) Inventors: Teruaki Sakata, Tokyo (JP); Tsutomu Yamada, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 15/737,549

(22) PCT Filed: Jun. 22, 2015

(86) PCT No.: PCT/JP2015/067814
§ 371 (c)(1),
(2) Date: Dec. 18, 2017

(87) PCT Pub. No.: WO2016/207933
PCT Pub. Date: Dec. 29, 2016

(65) Prior Publication Data
US 2018/0113757 A1    Apr. 26, 2018

(51) Int. Cl.
*G06F 11/08* (2006.01)
*H03K 19/173* (2006.01)
(Continued)

(52) U.S. Cl.
CPC .... *G06F 11/085* (2013.01); *G01R 31/318519* (2013.01); *H03K 19/173* (2013.01);
(Continued)

(58) Field of Classification Search
CPC ........ G06F 11/07; G06F 11/08; G06F 11/085; H03K 19/17728; H03K 19/17764; H03K 19/17744; G01R 31/318519
See application file for complete search history.

(56) References Cited

U.S. PATENT DOCUMENTS

| 7,870,299 B1* | 1/2011 | Sorensen | G06F 11/1004 |
| | | | 710/2 |
| 2009/0230255 A1* | 9/2009 | Lemonovich | G06F 15/17 |
| | | | 246/167 R |

(Continued)

FOREIGN PATENT DOCUMENTS

| JP | 5-327477 A | 12/1993 |
| JP | 2005-6376 A | 1/2005 |

(Continued)

OTHER PUBLICATIONS

International Search Report (PCT/ISA/210) issued in PCT Application No. PCT/JP2015/067814 dated Aug. 25, 2015 with English-language translation (Six (6) pages).

(Continued)

*Primary Examiner* — Jason Crawford
(74) *Attorney, Agent, or Firm* — Crowell & Moring LLP

(57) ABSTRACT

An object of the invention is to provide a field programmable gate array which is able to prevent an inappropriate value from being output to the outside of an FPGA even when an SRAM-based programmable logic portion is out of order and to secure safety of a system. The field programmable gate array of the invention includes a hard macro CPU in which a circuit structure is fixed, a programmable logic in which a circuit structure is changeable, a diagnosis circuit which diagnoses an abnormality of the programmable logic, and a fail-safe interface circuit which is able to control an external output from the programmable logic to a safe side, and the hard macro CPU outputs a fail-safe signal which is an output of a safe side to the fail-sate interface circuit when an error is detected by the diagnosis circuit.

12 Claims, 12 Drawing Sheets

(51) Int. Cl.
*G01R 31/3185* (2006.01)
*H03K 19/177* (2006.01)
*B61L 5/18* (2006.01)

(52) U.S. Cl.
CPC ... *H03K 19/1776* (2013.01); *H03K 19/17728* (2013.01); *H03K 19/17744* (2013.01); *H03K 19/17776* (2013.01); *B61L 5/18* (2013.01)

(56) References Cited

U.S. PATENT DOCUMENTS

| | | | |
|---|---|---|---|
| 2011/0145934 A1* | 6/2011 | Abramovici | G06F 21/76 |
| | | | 726/30 |
| 2013/0076322 A1 | 3/2013 | Tateno et al. | |
| 2014/0129871 A1* | 5/2014 | Poenaru | G06F 11/07 |
| | | | 714/2 |
| 2015/0355989 A1* | 12/2015 | Hayden | G06F 13/4027 |
| | | | 714/56 |
| 2016/0043719 A1* | 2/2016 | Benzer | H03K 19/007 |
| | | | 327/318 |
| 2016/0241247 A1* | 8/2016 | Kanno | H03K 19/1776 |

FOREIGN PATENT DOCUMENTS

| | | |
|---|---|---|
| JP | 2007-243671 A | 9/2007 |
| JP | 2011-216020 A | 10/2011 |
| JP | 2013-70263 A | 4/2013 |

OTHER PUBLICATIONS

Japanese-language Written Opinion (PCT/ISA/237) issued in PCT Application No. PCT/JP2015/067814 dated Aug. 25, 2015 (Four (4) pages).

\* cited by examiner

*FIG. 5*

```
1  main()
2  {
3      start_routine();          // START PROCESS
4      diag_pl();                // PL DIAGNOSIS PROCESS
5      initial_routine();        // INITIALIZATION PROCESS
6
7      while (1) {
8          rt_routine();              // RT PROCESS
9          STATUS = diag_pl();        // DIAGNOSIS PROCESS
10         if (STATUS == OK) {
11             trans_routine();       // INTERNAL TRANSFER IF DIAGNOSIS RESULT IS OK
12             output_routine();      // OUTPUT TO OUTSIDE
13         } else {
14             fs_routine();          // SAFETY PROCESS IF DIAGNOSIS RESULT IS NG
15             stop_routine();        // SYSTEM STOP
16         }
17
18         idle();                    // IDLE UNTIL NEXT CONTROL PERIOD
19     }
20
21     return (0);
22 }
```

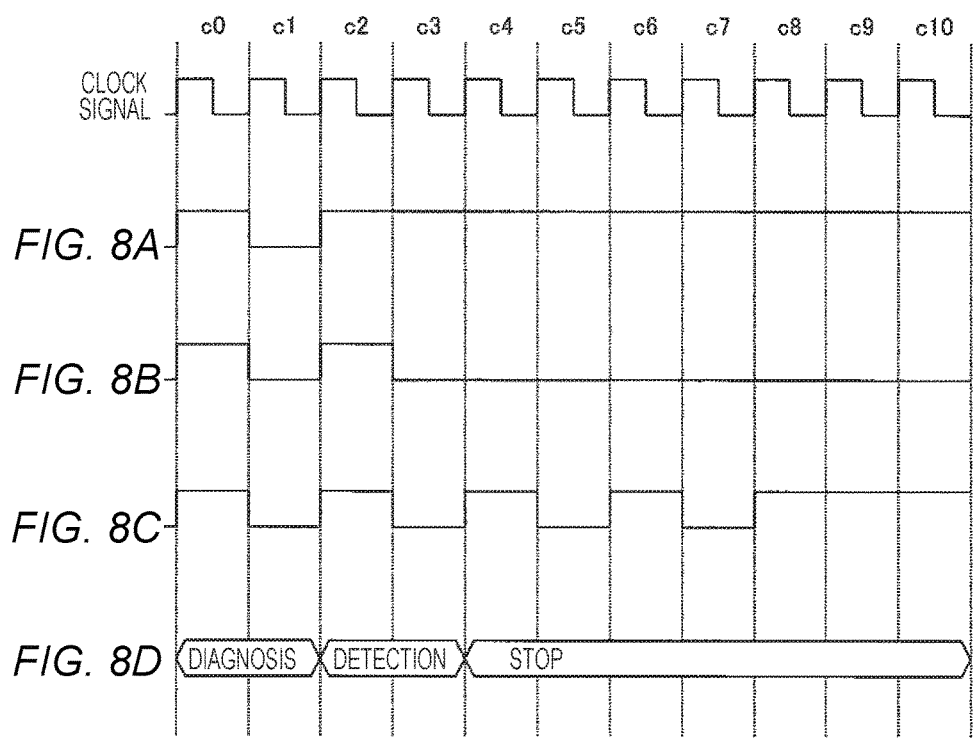

FIELD PROGRAMMABLE GATE ARRAY

TECHNICAL FIELD

The invention relates to a field programmable gate array.

BACKGROUND ART

In a control system where an extremely high reliability is required to secure safety in human life and environment such as a plant, a railway, a vehicle, and an airplane. In the worst case, a failure or an abnormality may occur in a system, and thus there is a need to take an action not to make the system out of control and fall into a dangerous state.

Therefore, a lot of reliability and safety is required in a control device which performs control in the system.

Until now, an ASIC (Application Specific Integrated Circuit) has been mainly used in the control of such a control device.

However, in recent years, a production cost of the ASIC is increased as a semiconductor process is departmentalized, and thus it is difficult to develop a new product in an industrial control system of which the number of production is less.

On the other hand, a field programmable gate array (hereinafter, referred to as FPGA) which has been practically used in 1980s is increased in integration and performance through a miniaturization and, in some cases, has been used in the industrial control system of which the number of production is less.

By the way, an SRAM (Static Random Access Memory)-based FPGA is primarily used in recent years.

With the SHAM-based FPGA, when power is input, arbitrary logic circuits can be realized by changing values to be written in an LUT (Look Up Table) which is configured in the SRAM.

However, with this feature, if a temporary failure called a soft error in which a bit of the SRAM is temporally changed occurs under the influence of noises from the outside and cosmic rays radiated from the air, the FPGA is configured to be different from a desired circuit. As a result, a malfunction of the system is caused, or the device may be stopped.

Therefore, particularly, in order to use an industrial specific SRAM-based FPGA, there is a need to securely operate a mechanism which shifts the device to a fail-safe (hereinafter, referred to as FS), which is a safe state, in a case where a failure is detected by a circuit in the FPGA and it is determined as a failure.

From such a background, there is proposed a technique to improve safety of the SRAM-based FPGA which is known for having the soft error compared to an ASIC in which a circuit configuration is fixed.

For example, PTL 1 discloses an example in which a protection circuit is mounted in the SPAM-based FPGA to improve resistance when the FPGA is out of order.

CITATION LIST

Patent Literature

PTL 1: JP 2007-243671 A

SUMMARY OF INVENTION

Technical Problem

By the way, after studying the conventional technique to improve safety of the FPGA, the inventor has found out the following facts.

In the example of PTL 1, the inner protection circuit is mounted in a fabric portion of the SRAM-based FPGA, and the inner protection circuit itself is also realized by a fabric portion of the SPAM-based FPGA. Therefore, it cannot be denied that there is a possibility to cause a failure in the inner protection circuit itself by the soft error. As a result, there is a problem that it cannot be guaranteed whether the SRAM-based FPGA normally operates as a system.

In addition, in a case where the system is configured such that the inner protection circuit and adjacent protection circuit illustrated in PTL 1 are provided in the outer portion of the SPAM-based FPGA, there is problems in that a high-speed/real-time operation is damaged because the circuit is attached to the outside, and in that an excessive amount of product costs is needed.

An object of the invention is to provide a field programmable gate array which is able to prevent an inappropriate value from being output to the outside of an FPGA even when an SRAM-based programmable logic (hereinafter, referred to as PL) portion is out of order and to secure safety of a system.

Solution to Problem

In order to solve the above problems, the configurations disclosed in claims are employed for example.

According to an aspect of the invention among a plurality of aspects to solve the above problems, a field programmable gate array of this application includes a hard macro central processing unit (CPU) in which a circuit structure is fixed, a programmable logic in which a circuit structure is changeable, a diagnosis circuit which diagnoses an abnormality of the programmable logic, a fail-safe interface circuit which is able to control an external output from the programmable logic to a safe side, and a function in which the hard macro CPU outputs a fail-safe signal which is an output to a safe side to the fail-safe interface circuit when an error is detected by the diagnosis circuit.

Advantageous Effects of Invention

According to the invention, it is possible to provide a field programmable gate array which is able to prevent an inappropriate value from being output to the outside of an FPGA even when an SRAM-based programmable logic (hereinafter, referred to as PL) portion is out of order and to secure safety of a system.

Objects, configurations, and features other than those described above will become clear through the explanation about the following embodiments.

BRIEF DESCRIPTION OF DRAWINGS

FIG. 5 is a diagram illustrating an example of software to operate a hard macro CPU in the field programmable gate array of the first embodiment.

FIGS. 8A to 8D are diagrams illustrating an example of a fail-safe output signal in a third embodiment.

DESCRIPTION OF EMBODIMENTS

Figure 1:
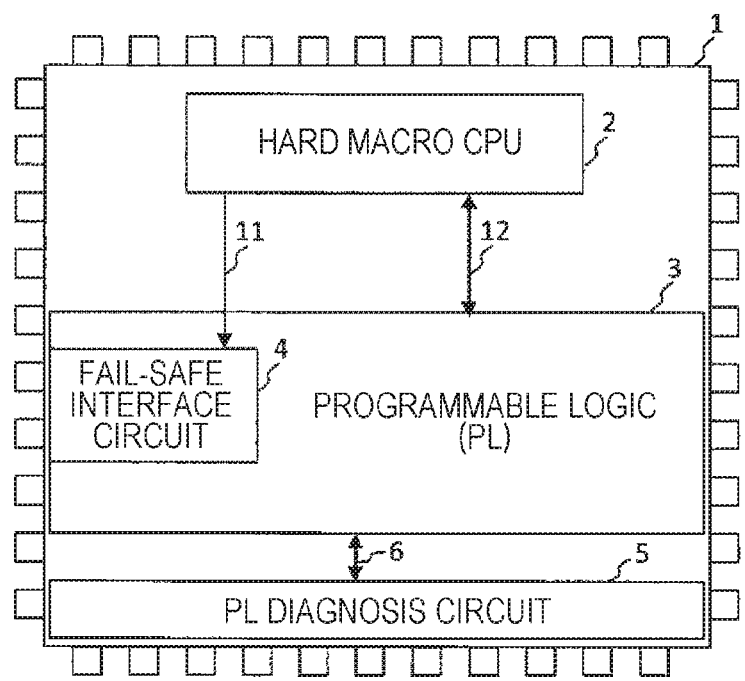
FIG. 1 is a diagram illustrating an example of a field programmable gate array of the invention in a first embodiment.

Hereinafter, embodiments of the invention will be described using the drawings.
First Embodiment FIG. 1 is a diagram illustrating an example of a field programmable gate array (FPGA) of the invention.

The FPGA (1) has therein a hard macro CPU (2) in which the circuit configuration is fixed and the function is not changeable, a programmable logic (PL) 3 in which the circuit configuration is changeable at the time of power activation or in operation, a fail-safe (FS) interface circuit 4 which is configured in the PL (3), and a PL diagnosis circuit 5.

The hard macro CPU (2) is mounted to output a unidirectional FS control signal 11 to the FS interface circuit 4, and a bidirectional PL control signal 12 is output from the hard macro CPU (2) with respect to the PL (3).

In addition, the PL diagnosis circuit 5 is a diagnosis circuit which can detect a failure or an error in a case where the failure or the error occurs in the PL (3), and is connected to the PL (3) through a PL diagnosis signal 6 to exchange information necessary for the diagnosis. In this embodiment, a diagnosis result of the PL diagnosis circuit 5 is sent to the hard macro CPU (2) through the PL (3). The diagnosis result may be directly notified from the PL diagnosis circuit 5 to the hard macro CPU (2).

FIG. 2 illustrates an example of mounting the FS interface circuit 4.

Figure 2A:
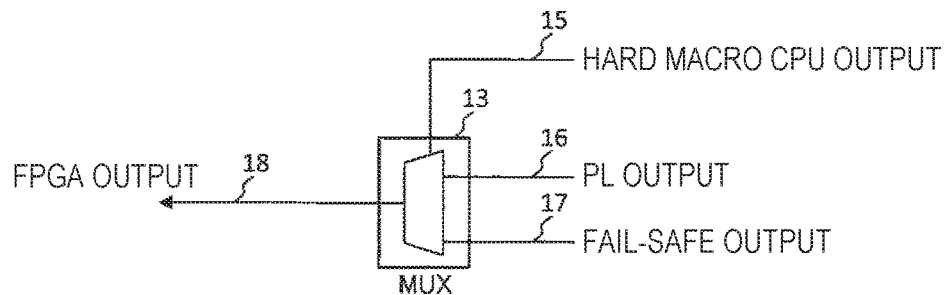
FIGS. 2A to 2C are diagrams illustrating an example of mounting a fail-safe interface circuit in the field programmable gate array of the first embodiment.

In the example of the FS interface circuit illustrated in FIG. 2(a), two outputs, a PL output 16 and an FS output 17, are selected by a multiplexer (MUX) 13, and output to the outside of the FPGA as an FPGA output 18. Two outputs 16 and 17 are selected depending on a value of a hard macro CPU output 15.

The multiplexer 13 herein uses a hard macro block to which a circuit structure built in the FPGA in advance is fixed, and also uses a signal output from the hard macro CPU as an output select signal, so that it is possible to increase resistance against a failure in software.

Figure 2B:
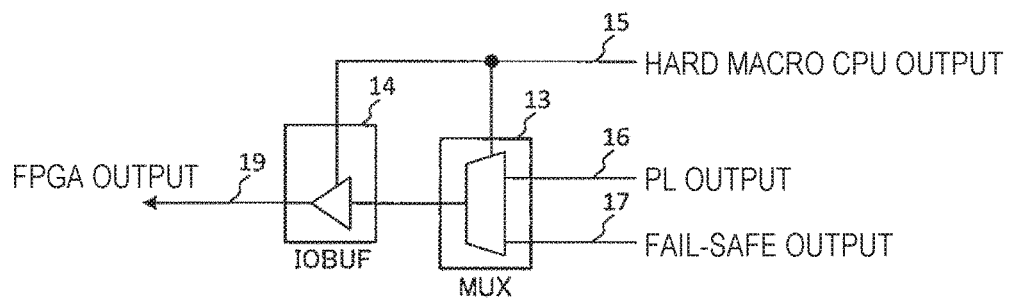

In addition the example of the FS interface circuit illustrated in FIG. 2(b) is different from, the example of the FS interface circuit illustrated in FIG. 2(a) in that an input/output buffer (IOBUF) 14 is added.

The hard macro CPU output 15 is also input to the input/output buffer 14, and an FPGA output 19 is output to the outside of the FPGA only in a period indicating that the hard macro CPU output 15 is allowed to be output.

Figure 2C:
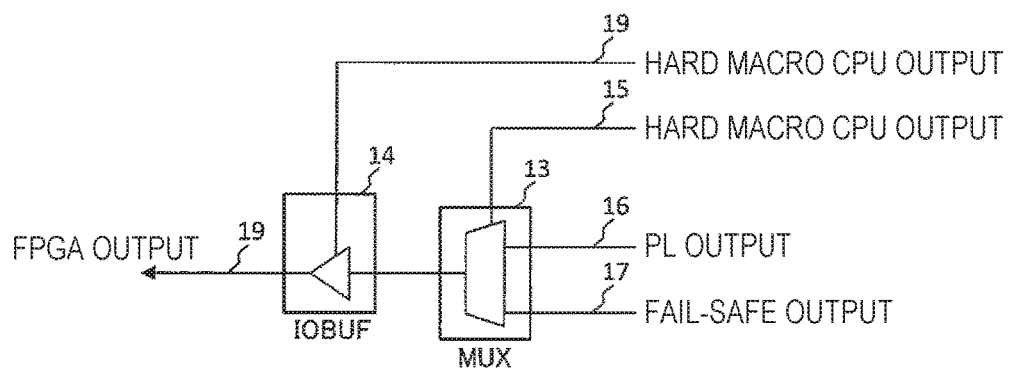

Further, FIG. 2(b) illustrates an example in which the same hard macro CPU output 15 is input to the multiplexer 13 and the input/output buffer 14 to simplify the control, and the control may performed separately by adding a hard macro CPU output 19 as illustrated in FIG. 2(c).

Figure 3:
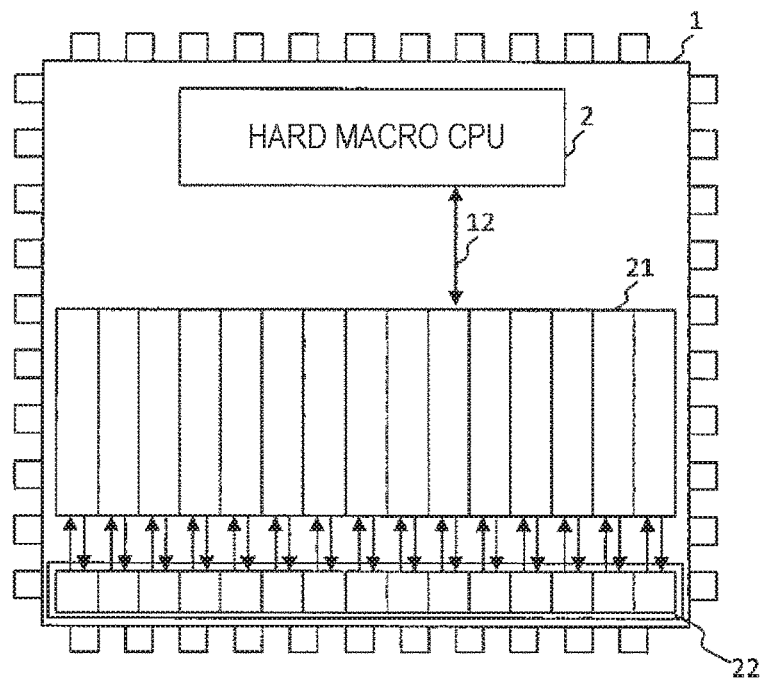
FIG. 3 is a diagram illustrating an example of mounting a PL diagnosis circuit in the field programmable gate array of the first embodiment.

As a PL diagnosis function described in FIG. 1, FIG. 3 illustrates an example in a case where a diagnosis circuit of a configuration random access memory (hereinafter, referred to as CRAM) is used.

In FIG. 3, the entire circuit of a PL (21) is divided into 15 columns, and accordingly a PL diagnosis circuit (22) which is a CRAM diagnosis circuit is also divided into 15 regions in correspondence to the PL (21) to diagnose the corresponding PL (21).

The PL diagnosis circuit 22 is a circuit which detects an inverse of data held in each column in the PL (21) using an algorithm based on a code theory which is generally mounted in an SPAM-based FPGA in recent years, and can be easily mounted as a PL diagnosis scheme in the FPGA of the invention.

Figure 4:
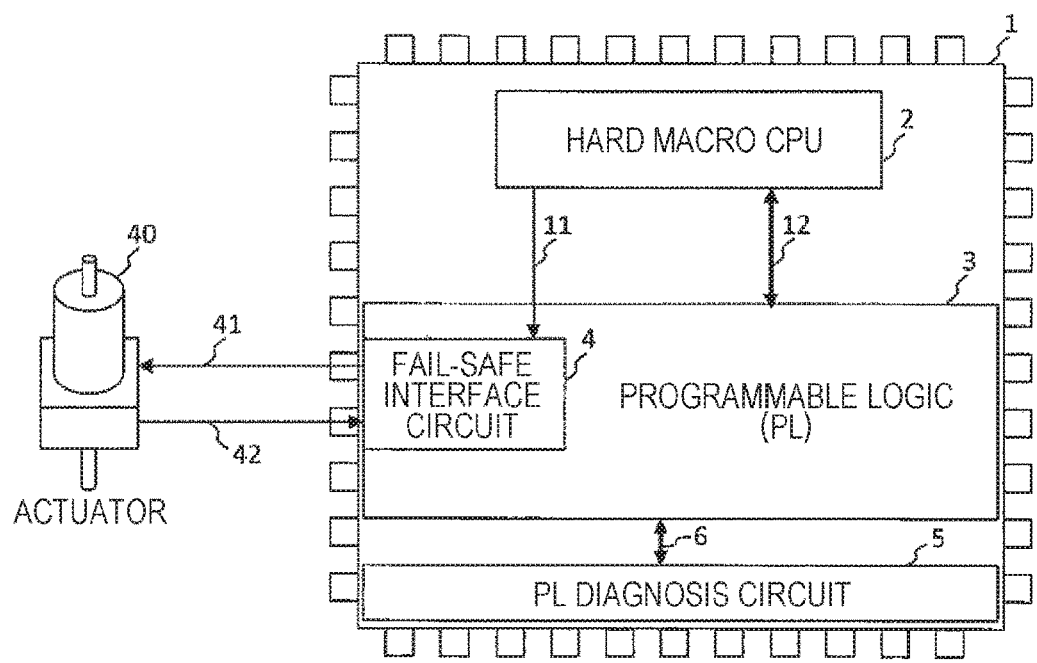
FIG. 4 is a diagram illustrating an example in a case where an actuator is controlled using the field programmable gate array of the first embodiment.

FIG. 4 is a diagram illustrating an example in a case where an actuator is controlled using the FPGA illustrated in FIG. 1.

In FIG. 4, an FPGA output signal 41 is output from the FS interface circuit 4 in the FPGA (1) to an actuator 40 to control the actuator 40, and the FS interface circuit 4 in the FPGA (1) receives an FPGA input signal 42 from the actuator 40 to monitor a state of the actuator 40 by the FPGA (1).

FIG. 5 is a diagram illustrating an example of a software program which operates the hard macro CPU in the FPGA of the invention.

A system using the FPGA of the invention operates by a program 31 of FIG. 5 which is executed by the hard macro CPU built in the FPGA, and the process starts from main( ) in the first row of the program 31 after power is input.

After power is input, the process proceeds in an order of a start process (start_routine( )) in the third row of the program 31, a PL diagnosis process (diag_pl( )) in the fourth row, and an initialization process (initial_routine ( )) in the fifth row. When the process enters a while loop in the seventh. row, a procedure from the eighth row to the eighteenth row is repeatedly performed.

During the repeating procedure, a value of a variable (STATUS) indicating a result of the PL diagnosis in the ninth row is checked to branch the procedure to an appropriate process.

FIG. 6 illustrates an example of an operation flow in a case where a system requiring a high safety is mounted using the FPGA, the system, and the software of the invention illustrated in FIGS. 1 to 5.

Figure 6A:
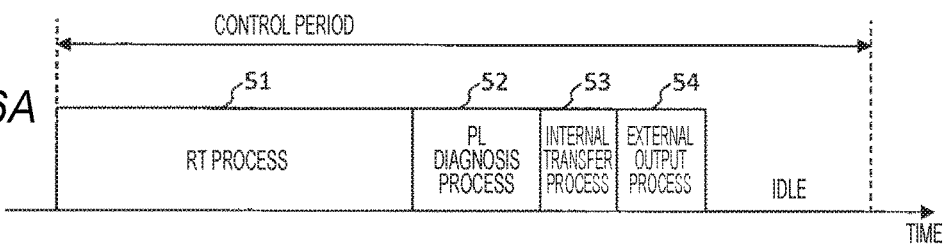
FIGS. 6A and 6B are diagrams illustrating an example of a timing chart in a case where control is performed on the basis of a control period using the field programmable gate array of the first embodiment.

FIG. 6(a) is a timing chart illustrating an example of a state where the system operates safely without failure.

The system is a system which repeats five processes: an RT process 51 in which the hardware of an PL portion performs a process of a highly real-time (hereinafter, referred to as RT) performance; a PL diagnosis process 52 in which the PL diagnosis is performed by the CRAM diagnosis circuit; an internal transfer process 53 in which data to be subjected to the PL process is transferred from the PL to the hard macro; an external output process 54 in which a control signal is output to a device connected to the outside of the FPGA; and an idle process in which the system waits for a next command doing nothing. FIG. 6(a) illustrates an example in which the operations normally keep going on in one period.

Figure 6B:
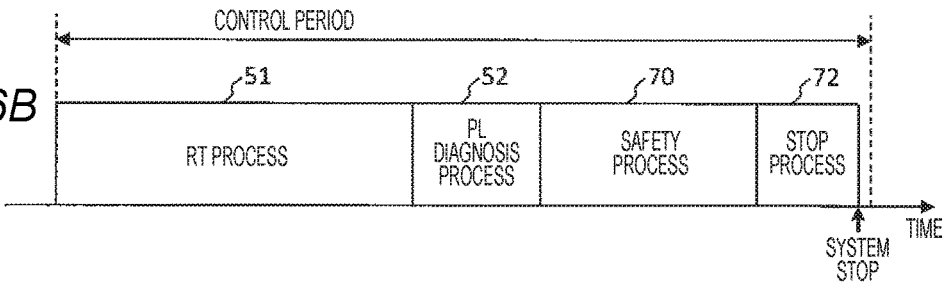

On the other hand, FIG. 6(b) is an example in a case where a failure occurs in the PL by the PL diagnosis process 52 in a control period, and illustrates an example in which a stop process 72 is performed after a safety process 70 to stop the system in a safe state without performing the external output process 54 differently from FIG. 6(a).

In this way, even when a failure such as a soft error occurs in the PL portion configured by the SRAM-based FPGA, the influence of the failure is not output to the outside of the FPGA. Therefore, it is possible to continue the operation of the system while keeping safety, and a mechanism to stop the system with safety can be easily established at a low cost.

Second Embodiment

Next, the description will be given about an example of the system using the FPGA of the invention in which a higher safety is realized.

Figure 7A:
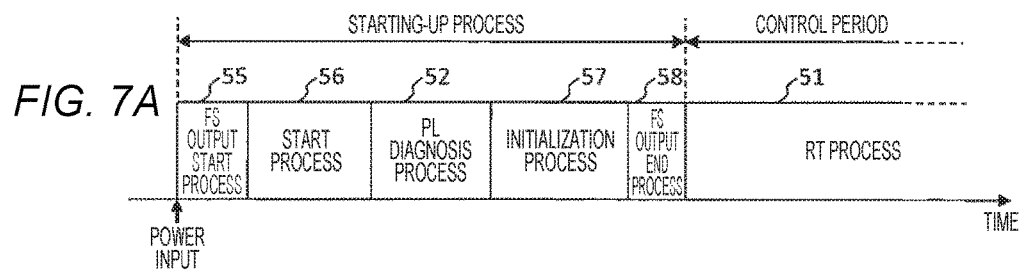
FIGS. 7A and 7B are diagrams illustrating an example of a timing chart in a case where control is performed on the basis of a control period in a second embodiment.

FIG. 7(a) is a timing chart illustrating an example of a starting-up process of the system using the FPGA of the invention, in which it is considered that the system operates in a control period with the same contents as those illustrated in the timing chart of FIG. 6 of the first embodiment.

In the system, as illustrated in FIG. 7(a), the starting-up process is performed after power is input and then an FS output start process 55 is first performed before the procedure enters a normal process by a control period, and the system becomes a state in which a signal indicating FS is output to a device connected to the FPGA.

After the FS output start process 55, a start process 56 is performed and minimum resources necessary for the system to operate are activated. Then, when the diagnosis of the PL is normally ended by the PL diagnosis process 52, an initialization process 57 is performed and an FS output end process 58 is performed at a time when the starting-up process of the system is completed, so that the output of the FPGA is connected to a device connected to the FPGA and the system enters a normal control period to start the RT process 51.

Figure 7B:
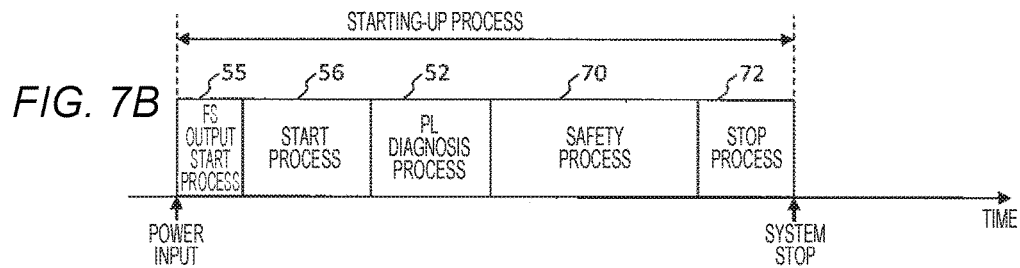

On the other hand, FIG. 7(b) illustrates an example in a case where the PL diagnosis process 52 during the starting-up process detects that a failure or an error occurs in the PL compared to the timing chart illustrated in FIG. 7(a). In this case, the safety process 70 is performed after the PL diagnosis process 52 ends to issue the FS output, and then the system is safely stopped by the stop process 72.

In this way, even when a failure occurs in the SRAM-based FPGA at an early timing when the system starts, the FS output can be processed. Therefore, it is possible to stop the system with safety before the system enters encounters a dangerous state.

Third Embodiment

Next, the description will be given about an example in a case where an FS configuration is realized not to output erroneous data to the outside of the FPGA of the invention.

FIG. 8 illustrates an example of four types of FS signals which are output from the FS interface circuit in the FPGA in synchronization with a clock signal.

FIG. 8(a) illustrates an example in a case where an FS signal is output which becomes a high potential (High) when a failure or an error occurs in the system. Herein, when an error is detected in the FPGA at a clock cycle c2, the High signal is output as the FS signal after a clock cycle c3.

FIG. 8(b) illustrates an example in a case where an FS signal is output which becomes a low potential (Low) when a failure or an error occurs in the system in contrast to FIG. 8(a). Herein, when an error is detected in the FPGA at the clock cycle c2, the Low signal is continuously output as the FS signal after the clock cycle c3.

FIG. 8(c) illustrates an example in a case where an alternate signal repeating High and Low at every clock cycle is output when the system, normally operates, and the FS signal of the high potential (High) is output when a failure or an error occurs in the system. Herein, when an error is detected in the FPGA at a clock cycle c7, the High signal is continuously output as the FS signal after a clock cycle c8.

FIG. 8(d) illustrates an example in a case where commands are realized by a plurality of bits in which the signal from the FS interface circuit in the FPGA is labeled. Clock cycles c0 and c1 indicate cycles when the diagnosis of the PL is performed, clock cycles c2 and c3 are cycles to detect a failure or an error in the PL, and c4 and later are cycles to stop a machine connected to the FPGA.

In this way, the machine to be connected can be controlled to be the FS even in the FPGA having a possible failure by applying the FPGA of the invention.

Fourth Embodiment

Next, the description will be given about an example in a case where a position of an external terminal to be directly connected to the hard macro portion is fixed to be mounted in the FPGA of the invention.

Figure 9A:
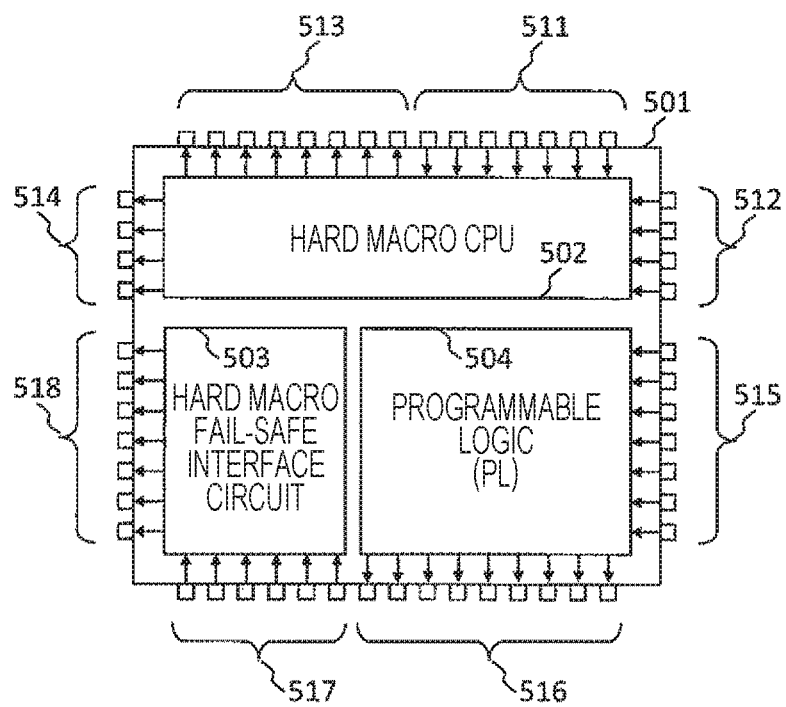
FIGS. 9A and 9B are diagrams illustrating an example of a layout of external pins which are connected to the hard macro and external pins which are connected to a programmable logic in a field programmable gate array of a fourth embodiment.

FIG. 9(a) is a diagram illustrating an example of an FPGA (501) mounted in a QuadFlat Package (QFP) in which the external terminals are disposed in the outer periphery of a semiconductor package. The FPGA (501) has therein a hard macro CPU (502), a hard macro PS interface circuit 503, and a PL (504).

In the FPGA (501), external terminal groups 511 and 512 are connected to serve as input terminals of the hard macro CPU (502), and external terminal groups 513 and 514 are connected to serve as output terminals of the hard macro CPU (502).

In addition, in the FPGA (501), an external terminal group 517 is connected to serve as input terminals of the hard macro FS interface circuit 503, and an external terminal group 518 is connected to serve as output terminals of the hard macro FS interface circuit 503.

Further, in the FPGA (501), an external terminal group 515 is connected to serve as input terminals of the PL (504), and an external terminal group 516 is connected to serve as output terminals of the PL (504).

Figure 9B:
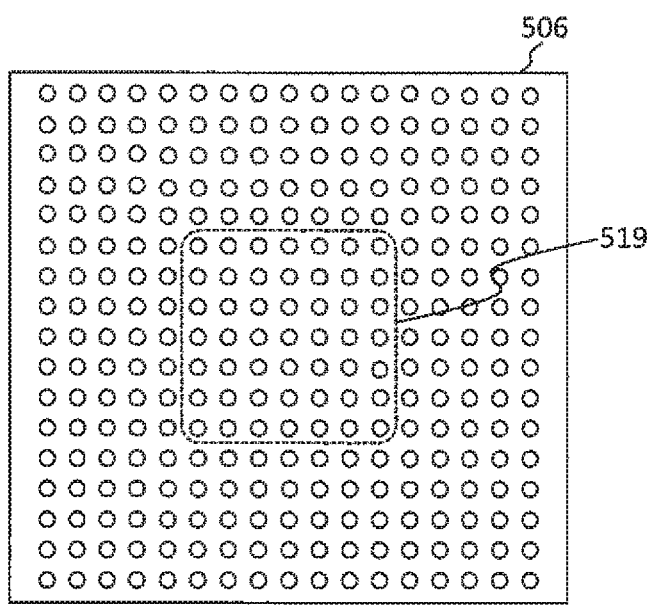

In addition, FIG. 9(b) is a diagram illustrating as example of an FPGA (506) which has therein the hard macro mounted in a Ball Grid Array (BGA) in which the external terminals are disposed in the bottom of the semiconductor package.

In the FPGA (506) of FIG. 9(b), the hard macro portion built in the FPGA (506) is connected only to an external terminal group 519, and the other external terminals are connected to the PL.

Figure 10A:
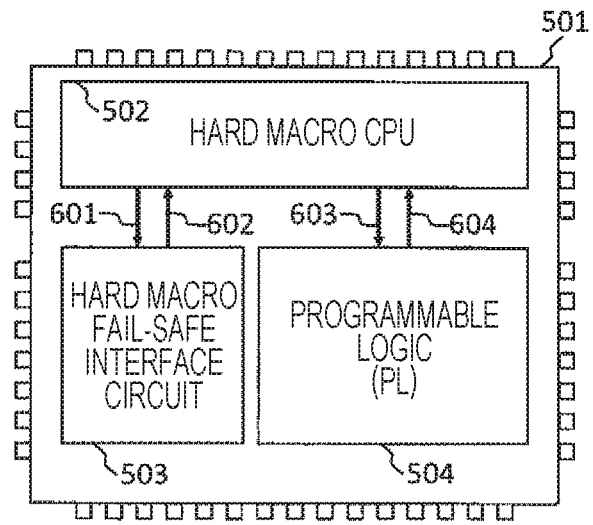
FIGS. 10A and 10B are diagrams illustrating an example in a case where a dedicated interface for the hard macro CPU is mounted in the field programmable gate array of the fourth embodiment.

FIG. 10(a) is a diagram explicitly illustrating an example of a communication interface in the FPGA compared to the FPGA (501) illustrated in FIG. 9(a).

The hard macro CPU (502) and the hard macro FS interface circuit 503 delicatedly communicate using an FS control transmission signal 601 and an FS control reception signal 602.

In addition, the hard macro CPU (502) and the PL (504) perform a dedicated communicate using a PL control transmission signal 603 and a PL control reception signal 604.

Figure 10B:
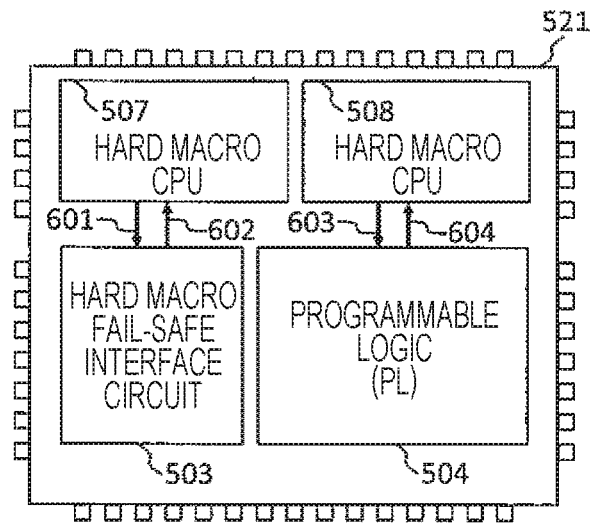

Further, FIG. 10(b) is different from the FPGA (501) illustrated in FIG. 10(a) in that the hard macro CPU is divided into portions 507 and 508.

In an FPGA (521) of FIG. 10(b), a hard macro CPU (507) performs a dedicated communication with the hard macro FS interface circuit 503, and a hard macro CPU (508) performs a dedicated communication with the PL (504).

In this way, the external terminal connected to the hard macro and the external terminal connected to the programmable logic are separately mounted in a package, so that a board is easily mounted in a case where a system is designed to have a high safety using the FPGA.

Fifth Embodiment

Next, the description will be given about an example in a case where the field programmable gate array of the invention is applied to a controller used in an industrial system.

Figure 11:
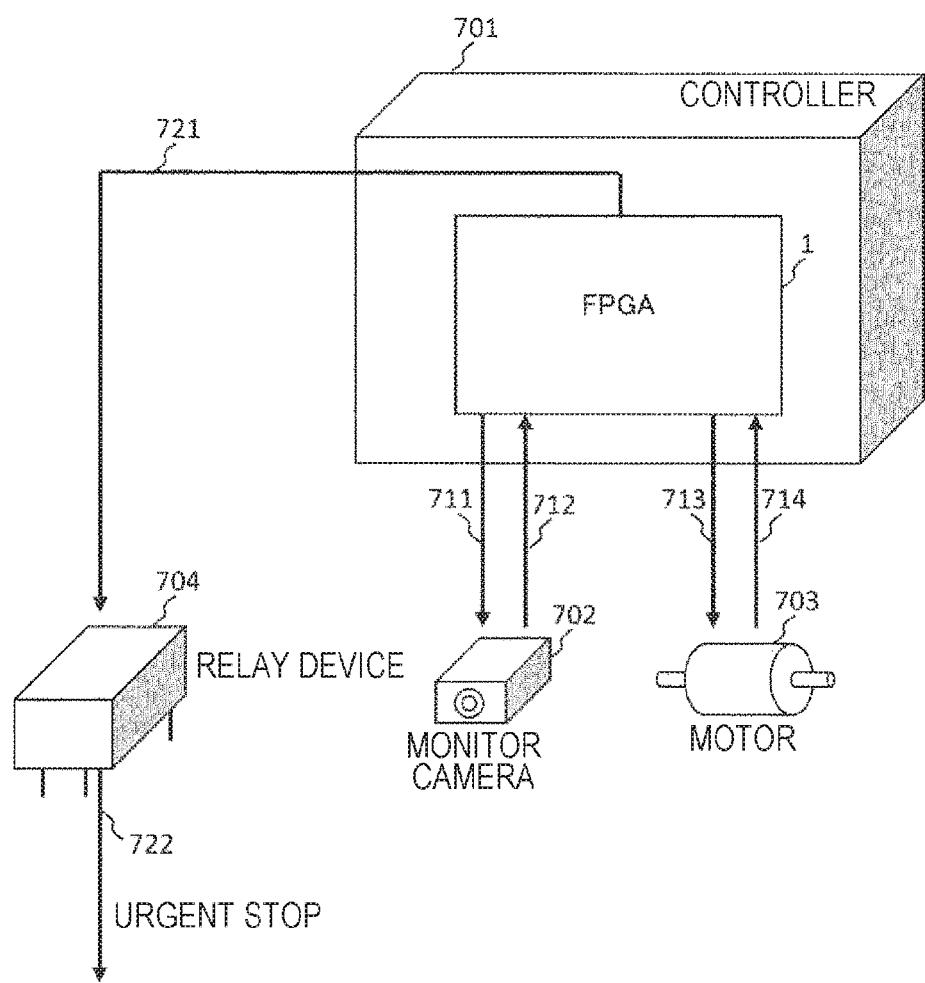
FIG. 11 is a diagram illustrating an example of mounting a controller in a fifth embodiment in which a field programmable gate array of the invention is used.

FIG. 11 is a diagram illustrating an example of a device which controls a power supply system, in which the FPGA (1) of the invention is mounted in one of the components of a controller 701.

The controller 701 always monitors an operation state of a power supply machine by a monitor camera 702, and performs a power generation control by a motor 703 connected to a power device portion.

In addition, a relay device 704 has a relay circuit built therein to urgently stop the power system with safety when there is a possibility for the system to fall into an abnormal state due to an influence such as a failure.

Since it is important that the operation state is monitored in real time, an image processing circuit is mounted in the PL of the FPGA (1). Therefore, a monitor camera control signal 711 is output from the PL of the FPGA (1) to the monitor camera 702, a monitor camera data signal 712 is output from the monitor camera 702 to the PL of the FPGA (1), and image processing is performed by the hardware of the PL.

In addition, it s also important that the motor operating the power supply machine operates in real time to control a frequency very finely. Therefore, a motor control circuit is mounted in the PL of the FPGA (1), a motor control signal 713 is output from the PL of the FPGA (1) to the motor 703, a motor data signal 714 is output from the motor 703 to the PL of the FPGA (1), and the monitor control is performed by the hardware of the PL.

On the other hand, since the relay device 704 is used to control an urgent stop operation in a case where the system is failed, there is a need to securely stop the system with safety when a failure is detected, and thus a high safety s required.

Therefore, a relay control signal 721 controlling the relay device 704 is transmitted from the FS interface circuit portion of the FPGA (1) to the relay device 704, and an urgent stop signal 722 is transmitted from the relay device 704 to a device to be stopped at an urgent time, so that the system is stopped with safety.

In this way, with the application of the FPGA of the invention, it is possible to easily realize a system in which a real time property and a high safety required in an industrial system are both satisfied.

Sixth Embodiment

Next, the description will be given about an example in a case where the field programmable gate array of the invention is applied to a railway signal control system.

Figure 12:
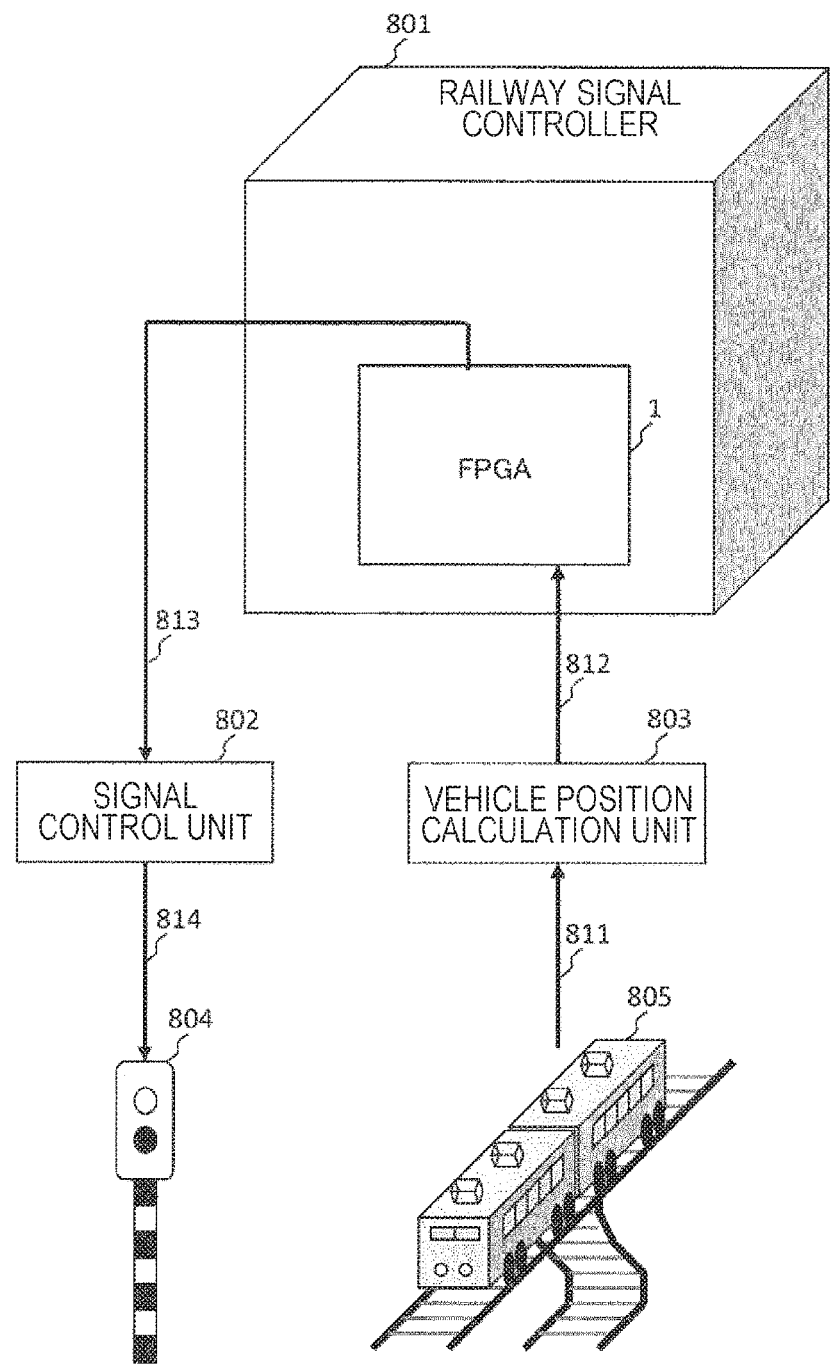
FIG. 12 is a diagram illustrating an example of mounting a railway signal control system in a sixth embodiment in which a field programmable gate array of the invention is used.

FIG. 12 is a diagram illustrating an example of a device of a railway signal system which controls advancing of a railway vehicle, in which the FPGA (1) of the invention is mounted in one of the components of a railway signal controller 801.

As position information which is obtained by a sensor attached in a rail while a railway vehicle 805 runs, railway vehicle position information 811 is transmitted to a railway vehicle position calculation unit 803 through a wired or wireless communication unit, and railway vehicle position data 812 calculated by the railway vehicle position calculation unit 803 is sent to the PL portion of the FPGA (1) of the railway signal controller 801, which are processed by hardware.

On the other hand, a traffic signal 804 is a device which issues a notification to stop the running railway vehicle when a railway system is at an urgent situation such as a failure or an accident. Since there is a need to securely operate to stop the railway vehicle at an urgent situation, a high safety is required.

Therefore, a signal control signal 813 which is transmitted to a signal control unit 802 to control the traffic signal 804 is transmitted from the FS interface circuit portion of the FPGA (1) to the signal control unit 802 and a stop instruction signal 814 is transmitted at an urgent situation for the stop notification from the signal control unit 802 to the traffic signal 804 to safely stop the railway vehicle.

In this way, with the application of the FPGA of the invention, it is possible to easily realize a high safety system in a railroad system required of an extremely high safety.

Seventh Embodiment

Next, the description will be given about an example in a case where the field programmable gate array of the invention is applied to a drive support system of a vehicle.

Figure 13:
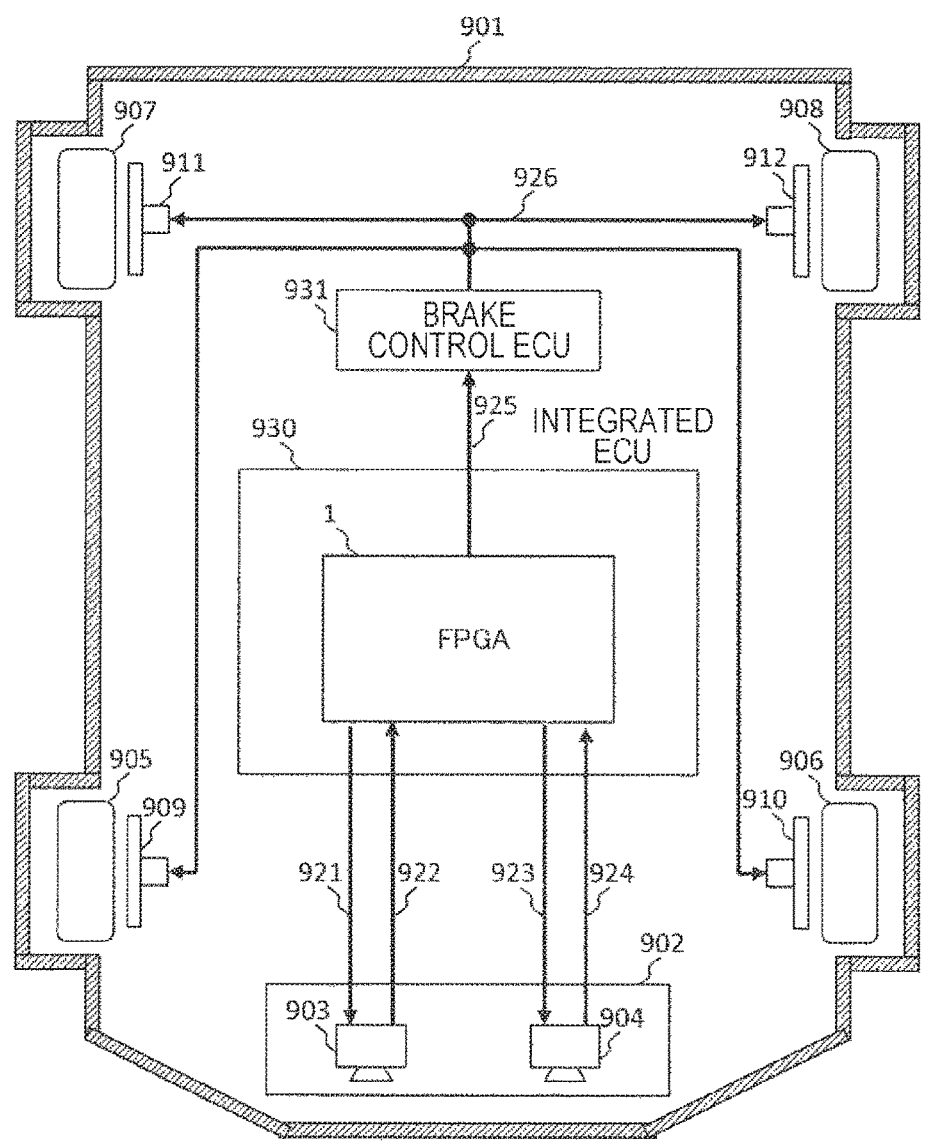
FIG. 13 is a diagram illustrating an example of mounting a drive support system for a vehicle in a seventh embodiment in which a field programmable gate array of the invention is used.

FIG. 13 is a diagram illustrating an exemplary configuration of the drive support system of a vehicle, in which image information acquired during the running is used to control the running. The FPGA (1) of the invention is mounted in one of the components of an integrated ECU (Electric Control Unit) 930 which performs the entire control of a vehicle 901.

The vehicle 901 has a function of recognizing image information acquired during the running by a stereoscopic camera 902 attached in the front side of the vehicle.

There are provided with two monocular cameras 903 and 904 in the stereoscopic camera 902. Monocular camera control signals 921 and 923 are output from the PL in the FPGA (1) to two monocular cameras 903 and 904 for the control. The monocular cameras 903 and 904 transmit, monocular camera data signals 922 and 924 to the PL of the FPGA (1), and the PL processes the signals on the basis of an image processing algorithm by a mounted hardware.

On the other hand, there is a need to safely stop the vehicle 901 by securely operating brakes 909, 910, 911, and 912 attached to front wheels 905 and 906 and real wheels 907 and 908 at an urgent situation in a case where the system is out of order in the vehicle 901. If the vehicle would not stop at an urgent situation, it could fall into a dangerous situation, and thus a high safety is required.

Therefore, a brake control signal 925 to be transmitted to a brake control ECU (931) which controls the brakes 909, 910, 911, and 912 is transmitted from the FS interface circuit portion of the FPGA (1) to the brake control ECU (931) and a stop instruction signal 926 is transmitted at an urgent situation from the brake control ECU (931) to the respective brakes to stop the front wheels and the real wheels so as to safely stop the vehicle.

In this way, with the application of the FPGA of the invention, a system required for a real time property of the image processing or a system required for a high safety of the brakes can be easily realized by using one FPGA.

As described in the above embodiment, it is possible to provide a mechanism which is able to protect the system with safety in a case where the SRAM-based FPGA is used in a device considering safety as being important, the SRAM-based FPGA built in the CPU which has come into use in recent years is utilized not to output an inappropriate value to the outside of the FPGA even when the PL portion configured by the SRAM is out of order.

In other words, the PL portion having a potential failure is configured to output a value to the outside through the fail-safe circuit which is able to control the output toward a safe side. Then, when an error of the PL portion is detected, the fail-safe circuit is controlled by the hard macro CPU which is less concern about a failure to a safe side.

With this configuration, it is possible to move the system to a safe state before the influence is transferred to the external device even if the FPGA is out of order. As a result, it is possible to realize a system which operates fast in real time at a low cost.

Further, the invention is not limited to the above embodiments, and various modifications can be made. For example, the embodiments are described a clearly understandable way for the invention, and thus the invention is not necessarily to provide all the configurations described above. In addition, some configurations of a certain embodiment may be replaced with the configurations of another embodiment, and the configuration of the other embodiment may also be added to the configuration of a certain embodiment. Further, additions, omissions, and substitutions may be made on some configurations of each embodiment using other configurations.

REFERENCE SIGNS LIST 1, 501, 506, 521 field programmable gate array (FPGA)
2, 502, 507, 508 hard macro CPU
3, 21, 504 programmable logic (PL)
4 fail-safe interface circuit
5, 22 PL diagnosis circuit
13 multiplexer
14 input/output buffer
40 actuator
51 RT process
52 PL diagnosis process
53 internal transfer process
54 external output process
55 fail-safe output start process
56 start process
57 initialization process
58 fail-safe output end process
70 safety process
72 stop process
503 hard macro fail-safe interface circuit
701 controller
702 monitor camera
703 motor
704 relay device
801 railway signal controller
802 signal control unit
803 railway vehicle position calculation unit
804 traffic signal
805 railway vehicle
901 vehicle
902 stereoscopic camera
930 integrated ECU
931 brake control ECU

The invention claimed is:

1. A field programmable gate array, comprising:
a hard macro CPU in which a circuit structure is fixed;
a programmable logic in which a circuit structure is changeable;
a diagnosis circuit which diagnoses an abnormality of the programmable logic;
a fail-safe interface circuit which is able to control an external output from the programmable logic to a safe side; and
a function in which the hard macro CPU is instructed to output a fail-safe signal which is an output to a safe side to the fail-safe interface circuit when an error is detected by the diagnosis circuit;
wherein the fail-safe interface circuit is provided in the programmable logic, and
wherein an instruction from the hard macro CPU to the fail-safe interface circuit is issued through a communication path in which data is able to be transmitted only from the hard macro to the programmable logic.

2. The field programmable gate array according to claim 1,
wherein the fail-safe interface circuit is mounted in the hard macro.

3. The field programmable gate array according to claim 1,
wherein the fail-safe interface is controlled by a software program which is executed by the hard macro CPU.

4. The field programmable gate array according to claim 1,
wherein the diagnosis circuit diagnoses the programmable logic using a cyclic redundancy check or an error correcting code of a configuration random access memory.

5. The field programmable gate array according to claim 1,
wherein the fail-safe signal is output from the fail-safe interface circuit to the control system when a starting-up process of a control system connected to the field programmable gate array starts, and
wherein an output of the fail-safe signal from the fail-safe interface circuit to the control system is ended when the starting-up process of the control system is ended.

6. The field programmable gate array according to claim 1,
wherein a high potential (High) fixed value or a low potential (Low) fixed value is output as the fail-safe signal from the fail-safe interface.

7. The field programmable gate array according to claim 1,
wherein an alternate signal in which a high potential (High) and a low potential (Low) are repeated at a certain interval is output as the fail-safe signal from the fail-safe interface.

8. The field programmable gate array according to claim 1, wherein a command configured by a plurality of bits is output as the fail-safe signal from the fail-safe interface.

9. The field programmable gate array according to claim 1,
wherein external terminals of the field programmable gate array is divided into
an external terminal which is connected dedicatedly to the hard macro CPU,
an external terminal which is connected dedicatedly to the programmable logic, and
an external terminal which is connected dedicatedly to the fail-safe interface circuit.

10. The field programmable gate array according to claim 9,
wherein the field programmable gate array includes the external terminals along four sides of a package.

11. The field programmable gate array according to claim 9,
wherein the field programmable gate array includes the external terminals in a bottom surface of a package.

12. A field programmable gate array, comprising:
a hard macro CPU in which a circuit structure is fixed;
a programmable logic in which a circuit structure is changeable; and
a fail-safe interface circuit which is able to control an external output from the programmable logic to a safe side,
wherein the hard macro CPU, the programmable logic, and the fail-safe interface are disposed with an interval therebetween in the field programmable gate array;
wherein the fail-safe interface circuit is provided in the programmable logic; and
wherein an instruction from the hard macro CPU to the fail-safe interface circuit is issued through a communication path in which data is able to be transmitted only from the hard macro to the programmable logic.

* * * * *